US011842481B2

(12) United States Patent
Liao et al.

(10) Patent No.: US 11,842,481 B2
(45) Date of Patent: Dec. 12, 2023

(54) DEFECT OFFSET CORRECTION

(71) Applicant: Taiwan Semiconductor Manufacturing Co., Ltd., Hsinchu (TW)

(72) Inventors: Chien-Ko Liao, Taichung (TW); Ya-Hsun Hsueh, Yunlin County (TW); Sheng-Hsiang Chuang, Hsinchu (TW); Hsu-Shui Liu, Pingjhen (TW); Jiun-Rong Pai, Zhubei (TW); Shou-Wen Kuo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 17/881,338

(22) Filed: Aug. 4, 2022

(65) Prior Publication Data

US 2022/0375057 A1 Nov. 24, 2022

Related U.S. Application Data

(63) Continuation of application No. 17/098,895, filed on Nov. 16, 2020, now Pat. No. 11,430,108, which is a continuation of application No. 16/107,857, filed on Aug. 21, 2018, now Pat. No. 10,839,507.

(60) Provisional application No. 62/592,661, filed on Nov. 30, 2017.

(51) Int. Cl.
*G06T 7/33* (2017.01)
*G06T 7/00* (2017.01)
*G06T 7/73* (2017.01)
*G06T 5/00* (2006.01)
*H01L 21/66* (2006.01)

(52) U.S. Cl.
CPC .............. *G06T 7/001* (2013.01); *G06T 5/006* (2013.01); *G06T 7/33* (2017.01); *G06T 7/74* (2017.01); *H01L 22/20* (2013.01); *G06T 2207/30148* (2013.01); *G06T 2207/30204* (2013.01); *H01L 22/12* (2013.01)

(58) Field of Classification Search
CPC .......... G06T 7/001; G06T 5/006; G06T 7/33; G06T 7/74; G06T 2207/30148; G06T 2207/30204; H01L 22/20; H01L 22/12
See application file for complete search history.

(56) References Cited

U.S. PATENT DOCUMENTS

| | | | |
|---|---|---|---|
| 2015/0076371 A1* | 3/2015 | Huang | H01L 21/67276 156/345.32 |
| 2015/0125053 A1* | 5/2015 | Vieceli | G06T 7/74 382/129 |
| 2018/0188185 A1 | 1/2018 | Tsai | |

* cited by examiner

*Primary Examiner* — Chuong A Ngo
(74) *Attorney, Agent, or Firm* — Duane Morris LLP

(57) ABSTRACT

A method includes: receiving a defect map from a defect scanner, wherein the defect map comprises at least one defect location of a semiconductor workpiece; annotating the defect map with a reference fiducial location of the semiconductor workpiece; determining a detected fiducial location within image data of the semiconductor workpiece; determining an offset correction based on comparing the detected fiducial location with the reference fiducial location; producing a corrected defect map by applying the offset correction to the defect map, wherein the applying the offset correction translocates the at least one defect location; and transferring the corrected defect map to a defect reviewer configured to perform root cause analysis based on the corrected defect map.

20 Claims, 8 Drawing Sheets

DEFECT OFFSET CORRECTION

CROSS-REFERENCE TO RELATED APPLICATIONS

This application is a continuation of U.S. patent application Ser. No. 17/098,895, filed Nov. 16, 2020, which is a continuation application of U.S. patent application Ser. No. 16/107,857, filed Aug. 21, 2018, now U.S. Pat. No. 10,839, 507, which claims priority to U.S. Provisional Patent Application No. 62/592,661, filed Nov. 30, 2017. The contents of each are incorporated by reference in their entireties.

BACKGROUND

Modern assembly line manufacturing processes are typically highly automated to manipulate materials and devices and create a finished product. Quality control processes often rely on human skill, knowledge and expertise for inspection of the manufactured product both during manufacture and as a finished product.

Current assembly line processes for semiconductor workpieces (e.g., wafers or photomasks) employ inspection techniques that rely on manual analysis by one or more engineers and/or assembly line operators. Such techniques require large amounts of overhead and expensive hardware, but still fail to produce satisfactory results. Therefore, conventional inspection techniques are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
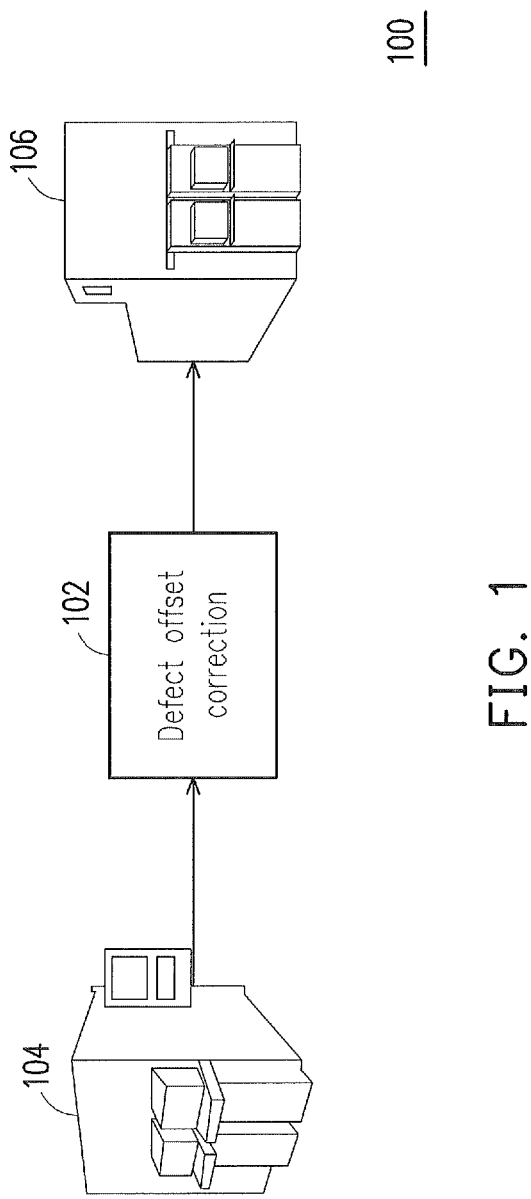
FIG. 1 is a block diagram that illustrates a defect offset correction module in relation to a defect scanner and a defect reviewer, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of defect offset correction. Defect offsets may occur when the coordinates (e.g., representations of locations) of defects, as represented in a defect map produced by a defect scanner in accordance with the coordinate system of the defect scanner, does not align with the coordinate system of a defect reviewer. Accordingly, due to defect offsets, a defect reviewer may not be directed to find and review the defects found by a defect scanner in a defect map.

A defect scanner may find defects across a semiconductor workpiece (e.g., an integrated circuit or wafer with multiple dies separated along scribe lines) and produce a defect map that notes where the defects are located across the semiconductor workpiece. The defect map may include a listing of defect locations (e.g., locations of defects). In certain embodiments, the defect map may be represented (e.g., formatted) as a table, such as a table suitable for storage in a relational database or a flat file database. Examples of a defect scanner may include the Surfscan SP5 and Surfscan SP3, both produced by KLA-Tencor Corporation headquartered in Milpitas, California A defect reviewer may review the defects detected by the defect scanner in the defect scan. In certain embodiments, the defect reviewer may perform root cause analysis to determine common causes of the various defects found by the defect scanner. Typically, the defect reviewer will review the defect map (e.g., a table of defect locations) and perform root cause analysis based on the defect map. Examples of defect reviewers may include SEMVision™ G2, produced by Applied Materials, Inc. headquartered in Santa Clara, California Root cause analysis may be analysis of the various defects identified in the defect scan for common causes of the individual defects, such as defects determinable from an embedded defect and/or electrical failure analysis.

As noted above, typically, a defect map is produced by a defect scanner, which is different than a defect reviewer that reviews the defects identified in the defect scan. Also, defect scanners and defect reviewers may be different machines and may be produced by different companies. Therefore, defect scanners and defect reviewers may not be well integrated such that coordinates that represent locations of defects noted in a defect map may not be automatically usable by a defect reviewer for root cause analysis without some kind of quality control. Also, as semiconductor workpieces have evolved, functional density (e.g., the number of interconnected devices per chip area) has generally increased while geometry sizes have decreased. This increase in functional density and decrease in geometry sizes have increased the sensitivity of semiconductor processing to defect offsets. The quality control for defect offsets, or misalignment between defect locations noted in a defect map and defect locations noted for defect review by a defect reviewer (in accordance with the coordinate system of the defect reviewer), may typically be quality controlled manually by one or more engineers and/or assembly line operators. Accordingly, defect offset correction as described further below may advantageously provide an automated system and process to correct for defect offsets in an automated manner, without requiring manual intervention and the high overhead required by manual quality control.

As will be discussed further below, defect offset correction may include embedding fiducials, or physical reticules, into a semiconductor workpiece that is to undergo semiconductor workpiece defect review (e.g., determination root causes for defects so that prophylactic, or preventative, measures may be taken for subsequently manufactured semiconductor workpieces). A single semiconductor workpiece may include several fiducials at various locations across the semiconductor workpiece. These various locations may be within scribe lines.

Defect offset correction may include a defect offset correction process performed by a defect offset correction module. As introduced above, a defect map may note locations for a defect as determined by the defect scanner. Also, based upon the coordinate system of the defect map, the defect map produced by the defect scanner may be annotated with reference fiducial locations based upon the known positions for embedded fiducials in a semiconductor workpiece (e.g., wafer). This defect map updated with reference fiducial locations may be termed as a fiducial updated defect map. The reference fiducial location may be characterized by al detectible reference fiducial mark at the reference fiducial location. Accordingly, the defect offset correction process may analyze and correct for fiducial offsets in the fiducial updated defect map. Specifically, the defect offset correction process may include detecting fiducials in image data based on the fiducial updated defect map, detecting the offsets based on the detected fiducials, and performing offset adjustments based on the detected offsets. This defect offset correction process may be repeated multiple times on a single semiconductor workpiece. By being repeated multiple times, the offset correction may be further calibrated at each repeated instance.

When analyzing image data characterizing a semiconductor workpiece (e.g., a wafer), the defect offset correction process may identify fiducials by matching a fiducial pattern to a fiducial contour. This may be performed by a pattern matching process that detects a fiducial in image data as a fiducial pattern that may be matched to a fiducial contour. The fiducial pattern may be image data reflective of a fiducial and determined to sufficiently match a fiducial contour (e.g., have an overlap that exceeds an edge threshold, as will be discussed further below). The fiducial contour may be a virtual reference of various details that should be detectible in a fiducial pattern. These various details may also be termed as contour features and may include unique edges, texture, color saturations, and/or other features that may be part of a fiducial contour and used to identify a fiducial pattern. Matching will be discussed further below but may include a determination of whether a portion of the image data includes contour features (e.g., edges, pixel proportions, color saturation, gradients, etc.) that are sufficiently similar to, or that are the same as, the contour features of the fiducial contour. In certain embodiments, the matching may be implemented with any of a variety of standard object recognition techniques, such as edge matching, greyscale matching, and gradient matching. Accordingly, a fiducial pattern may be determined (e.g., confirmed) when the fiducial contour sufficiently matches a possible fiducial pattern (e.g., image data that includes a possible fiducial pattern that is not yet determined, or confirmed to be a fiducial pattern). In particular embodiments, conventional pattern matching techniques may be utilized to identify a fiducial pattern in image data.

In certain embodiments, the defect offset correction process may account for, and remove, artifacts in image data that may occlude fiducial patterns. In further embodiments, the defect offset correction process may account for edge image data, or incomplete image data characterizing a fiducial. This may be accomplished by setting an edge threshold beyond which a partial fiducial match would be noted as a full fiducial match (even based on incomplete image data of a fiducial pattern, such as a cut off or incomplete fiducial pattern).

Upon identifying a fiducial pattern, offset adjustment may be performed that compensates for any offsets that may be detected based upon the locations of the fiducial patterns (e.g., detected fiducial locations), relative to an associated reference fiducial location. In certain embodiments, the associated reference fiducial location may be the center of an image of the semiconductor workpiece (e.g., wafer) at a reference fiducial location noted in a fiducial updated defect map. These offsets may be differences between the locations of a fiducial pattern (e.g., a detected fiducial location) and a reference fiducial location. For example, an offset may include a direction and a magnitude (e.g., 5 nm to the left). An offset correction may be determined based on the offset. The offset correction may be an inverse (e.g., an opposite) of the offset that, when applied to the defect map, may correct (e.g., compensate) for the offset and bring the defect map back into alignment with an accurate coordinate system (e.g., the coordinate system of the defect reviewer). Stated another way, an offset correction may be applied to the defect map based on an offset to produce corrected defect map. The corrected defect map may be in alignment with the coordinate system of a defect reviewer that is to perform defect review based on the defects noted (at corresponding defect locations) in the defect map. In certain embodiments, this correction (e.g., application of the offset correction) may be global across the defect map. Although defect offset correction may be described herein in relation to a defect scanner, defect reviewer and/or defects on a semiconductor workpiece, various embodiments in accordance with the present disclosure may correct for any type of offset (not just defect offsets) and between any type of devices (not just between a defect scanner and/or a defect reviewer) as desired for different applications. For example, various embodiments in accordance with this disclosure may be applied to correct for offsets in image data produced by a first device, when analyzed by a second device.

FIG. 1 is a block diagram 100 that illustrates a defect offset correction module 102 in relation to a defect scanner 104 and a defect reviewer 106, in accordance with some embodiments. As introduced above, the defect scanner 104 may find defects across a semiconductor workpiece and produce a defect map that notes where the defects are located across the semiconductor workpiece (e.g., wafer) under investigation. An example of a defect will be discussed in connection with FIG. 2. Returning to FIG. 1, examples of a defect scanner 104 may include the Surfscan SP5 and Surfscan SP3, both produced by KLA-Tencor Corporation headquartered in Milpitas, California.

The defect map produced by the defect scanner 104 may be processed by the defect offset correction module 102. The defect offset correction module 102 may execute the defect offset correction process (discussed above) to correct for defect offsets due to misalignment between the defect reviewer 106 and the defect scanner 104. For example, the defect offset correction module may analyze a fiducial annotated defect map (e.g., a defect map of defect locations annotated with reference fiducial locations), as will be discussed further below. The defect offset correction module may analyze image data characterizing a semiconductor workpiece (e.g., a wafer) under investigation to determine an offset as a difference in locations between a detected fiducial location and a reference fiducial location. The offset may then be corrected based upon this determined difference, as will be discussed further below. The corrected defect map (e.g., corrected fiducial updated defect map) may be transferred (e.g., sent) to the defect reviewer 106. Although the defect offset correction module is illustrated in FIG. 1 as separate from the defect scanner 104 or the defect reviewer 106, the defect offset correction module may be physically integrated as part of a housing for the defect scanner 104 or the defect reviewer 106 in accordance with various applications in different embodiments.

The defect reviewer 106 may review the defects detected by the defect scanner 104 in the defect scan. The defect reviewer may perform any of a variety of reviews of the defects detected by the detect scanner, such as root cause analysis to determine common causes of the various defects found by the defect scanner 104. These defects may be located at the defect locations noted in the corrected defect map. Examples of defect reviewers 106 may include SEMVision™ G2, produced by Applied Materials, Inc. headquartered in Santa Clara, California Root cause analysis may be analysis of the various defects identified in the corrected defect scan (e.g., in the corrected defect map) for common causes of the individual defects, such as defects determinable from an embedded defect and/or electrical failure analysis.

Figure 2:
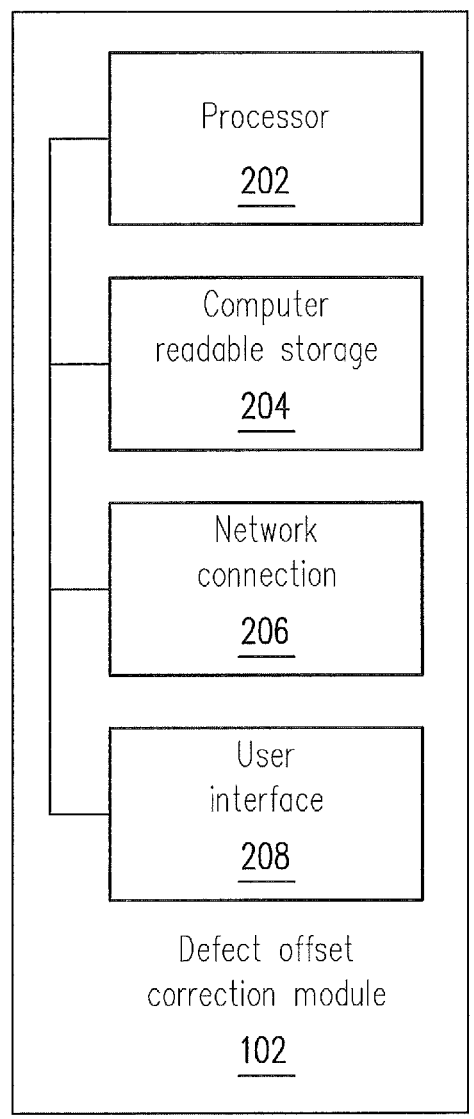
FIG. 2 is a block diagram that illustrates components of a defect offset correction module, in accordance with some embodiments.

FIG. 2 is a block diagram that illustrates components of the defect offset correction module 102, in accordance with some embodiments. The defect offset correction module 102 may include a processor 202 that is programmed to carry out any of the methods described herein. In further embodiments, the processor 202 may be implemented as one or more processors. The processor 202 may be operatively connected to a computer readable storage 204 (e.g., a memory and/or data store), a network connection module 206, and a user interface module 210. In some embodiments, the computer readable storage 204 may include defect offset correction process logic that may configure the processor to perform a defect offset correction process, as discussed further below. The defect offset correction process logic may include fiducial detection logic (that may configure the defect offset correction module to detect fiducials in image data), defect offset determination logic (that may configure the defect offset correction module to detect an offset), and offset adjustment logic (that may configure the defect offset correction module to correct for a detected offset). The computer readable storage may also store any other parameters, such as a fiducial contour, image data, defect scans, reference fiducial locations, edge thresholds, and any other parameter or information that may be utilized to perform defect offset correction.

The network connection module 206 may facilitate a network connection of the defect offset correction module 102 with other devices that may communicate with the network connection module, such as a defect scanner 104 and/or a defect reviewer 106, as discussed above in connection with FIG. 1. In certain embodiments, the network connection module 206 may facilitate a physical connection, such as a line or a bus. In other embodiments, the network connection module 206 may facilitate a wireless connection, such as over a wireless local area network (WLAN) by using a transmitter, receiver, and/or transceiver.

The defect offset correction module 102 may also include the user interface 208. The user interface may include any type of interface for input and/or output to an operator of the network connection module, including, but not limited to, a monitor, a laptop computer, a tablet, or a mobile device, etc. In certain embodiments, the user interface 208 may not be included in the defect offset correction module 102. Although the defect offset correction module 102 is illustrated as stand-alone in FIG. 2, the defect offset correction module 102 may be collocated, or within a same housing, as the defect scanner 104 and/or the defect reviewer 106, as discussed further above in connection with FIG. 1.

Figure 3:
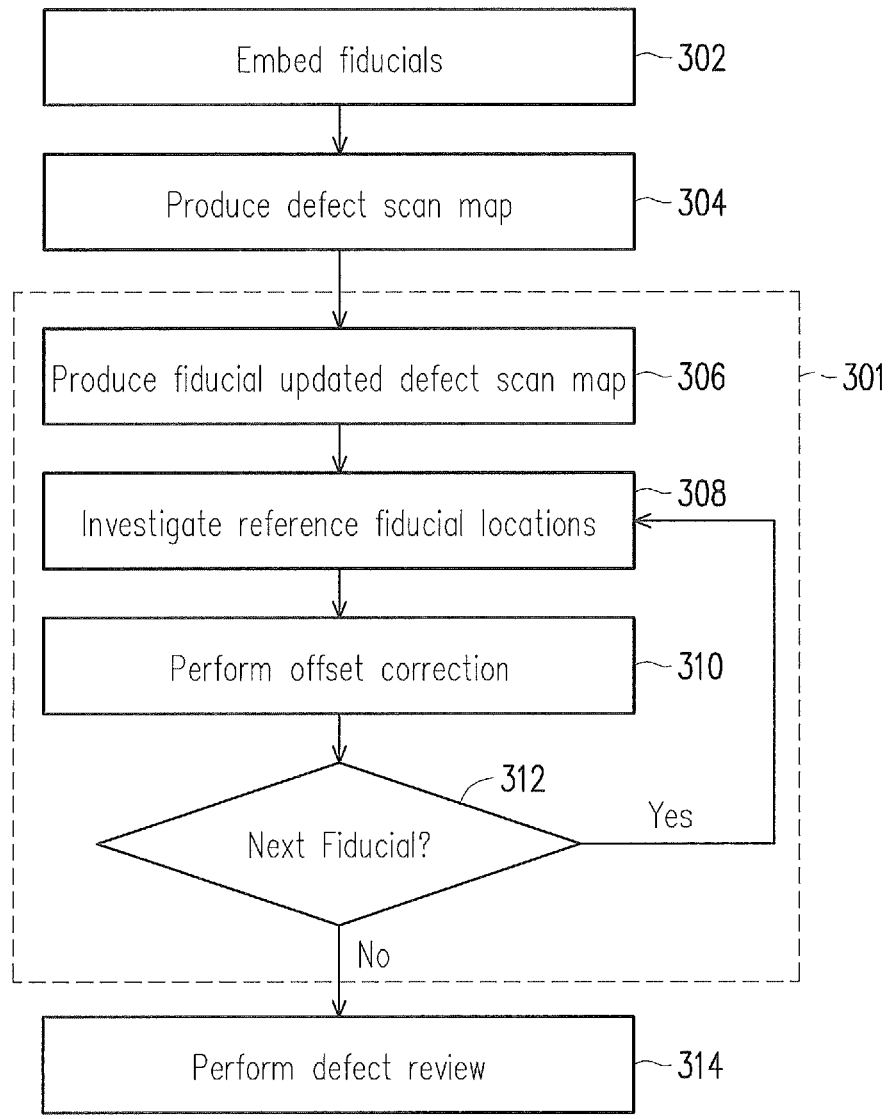
FIG. 3 is a flow chart of a defect review process, in accordance with some embodiments.

FIG. 3 is a flow chart of a defect review process 300, in accordance with some embodiments. The defect review process 300 may include a defect offset correction process 301 (noted in dotted lines) that may be performed by a defect offset correction module, as discussed further above. It is noted that the process 300 is merely an example, and is not intended to limit the present disclosure. Accordingly, it is understood that additional operations may be provided before, during, and after the process 300 of FIG. 3, certain operations may be omitted, certain operations may be performed concurrently with other operations, and that some other operations may only be briefly described herein.

At block 302, fiducials may be embedded in a semiconductor workpiece (e.g., a wafer or a photomask) and their locations recorded as reference fiducial locations (e.g., fiducial locations which may be annotated in a defect map to produce a fiducial updated defect map, as will be discussed further below). In certain embodiments, these fiducials may be embedded (e.g., inserted) within scribe lines of the semiconductor workpiece (e.g., wafer).

At block 304, a defect map may be produced. The defect map may be produced by a defect scanner. Defect scanners are discussed further above and will not be discussed again here for brevity. The defect map may include a listing of defect locations produced by the defect scanner.

At block 306, a fiducial updated defect map may be produced. The fiducial updated defect map may be the defect map annotated with reference fiducial locations. As discussed above, reference fiducial locations may be locations of fiducials as recorded from block 302. These reference fiducial locations may be inserted (e.g., annotated) within the defect map in accordance with the coordinate system of the defect map.

At block 308, the reference fiducial locations (annotated in the defect map to produce the fiducial updated defect map) may be investigated. The reference fiducial locations may be investigated based on captured image data that characterizes the semiconductor workpiece (e.g., wafer) under investigation. In certain embodiments, the image data may be captured by sensors such as a charge-coupled device (CCD), back-side illuminated (BSI) type detector, or complementary metal—oxide—semiconductor (CMOS) imaging sensor with respective red, green and blue filters, for RGB sensing.

Based on the captured image data, fiducials may be detected by the defect offset correction module. More specifically, fiducial patterns indicative of fiducials in a physical semiconductor workpiece may be detected in the captured image data. Detection of fiducial patterns may be described as detection of fiducials for brevity. The fiducial patterns may detected in accordance with various fiducial pattern detection processes as will be discussed below in connection with FIGS. 5A-5C. For example, the fiducial pattern detection processes may include pattern matching in which a possible fiducial pattern is determined in image data, and evaluated (e.g., matched) against a fiducial contour to determine whether the possible fiducial pattern and the fiducial contour sufficiently match (e.g., if they match at a level that exceeds an edge threshold). Fiducial detection processes may also include occlusion removal (e.g., removal of noise or artifacts in a defect scan that may affect fiducial detection) and/or partial fiducial detection (e.g., detection of a fiducial pattern based on partial or incomplete image data that includes only part of a fiducial pattern).

Once a fiducial pattern is detected, a detected fiducial location may be ascribed to the detected fiducial pattern. This detected fiducial location may be compared to an associated reference fiducial location. The associated reference fiducial location may be at the center of image data (e.g., an image) characterizing the semiconductor workpiece (e.g., wafer). The difference between the detected fiducial location and the associated reference fiducial location may be an offset. In certain embodiments, the offset may be visualized as a difference in location, such that the detected fiducial location are shifted by a particular magnitude (e.g., 5 nm) and direction (e.g., to the left) from the reference fiducial location.

At block 310, the defect offset correction module may perform an offset correction. As discussed above, upon identifying a fiducial pattern, offset correction (e.g., adjustment) may be performed that compensates for any offsets. These offsets may be differences between the locations of a detected fiducial location (e.g., a location of a detected fiducial pattern) and a reference fiducial location. For example, an offset may include a direction and a magnitude (e.g., 5 nm to the left). Accordingly, an offset correction may be determined based on the offset. The offset correction may be an inverse (e.g., an opposite) of the offset that, when applied to the image data, may correct (e.g., compensate) for the offset and bring the defect map more into alignment with an accurate coordinate system (e.g., the coordinate system of a receiving defect reviewer). Stated another way, an offset correction may be applied to the defect map based on an offset to produce a corrected defect map (and/or a corrected fiducial updated defect map). The corrected defect map may be more in alignment with the coordinate system of an image reviewer that is to perform defect review based on the defects detected (at corresponding defect locations) in the defect map. In certain embodiments, this correction (e.g., application of the offset correction) may be global across the defect map (and/or the corrected fiducial updated defect map).

At block 312, the defect offset module may determine whether there are additional fiducials to be investigated. As discussed above in connection with block 302, a semiconductor workpiece may include multiple fiducials. Accordingly, offsets may be determined for each of the multiple fiducials. Stated another, the defect offset correction process may be serial and repeated multiple times for multiple fiducials on a single semiconductor workpiece. By being repeated multiple times, the offset correction process may perform further calibrations at multiple instances and at more than one area, so that offset correction may be more accurate. If there are additional fiducials to investigate, the process 300 returns to block 308 and the additional fiducial is investigated. If there are no additional fiducials to investigate, the process proceeds to block 314 in which defect review is performed.

As noted above, blocks 306, 308, 310, and 312 may be performed by a defect offset correction module and may be collectively termed as a defect offset correction process 301. Various aspects of a defect offset correction process will be discussed further below.

At block 314, a defect review is performed. The defect review may be performed by a defect reviewer and be based on the corrected defect map. The defect reviewer may perform root cause analysis to determine common causes of the various defects found by the defect scanner. Root cause analysis may be analysis of the various defects identified in the defect map for common causes of the individual defects, such as defects determinable from an embedded defect and/or electrical failure analysis. The defect review and defect reviewer is discussed above in connection with FIG. 1 and will not be repeated here for brevity.

Figure 4A:
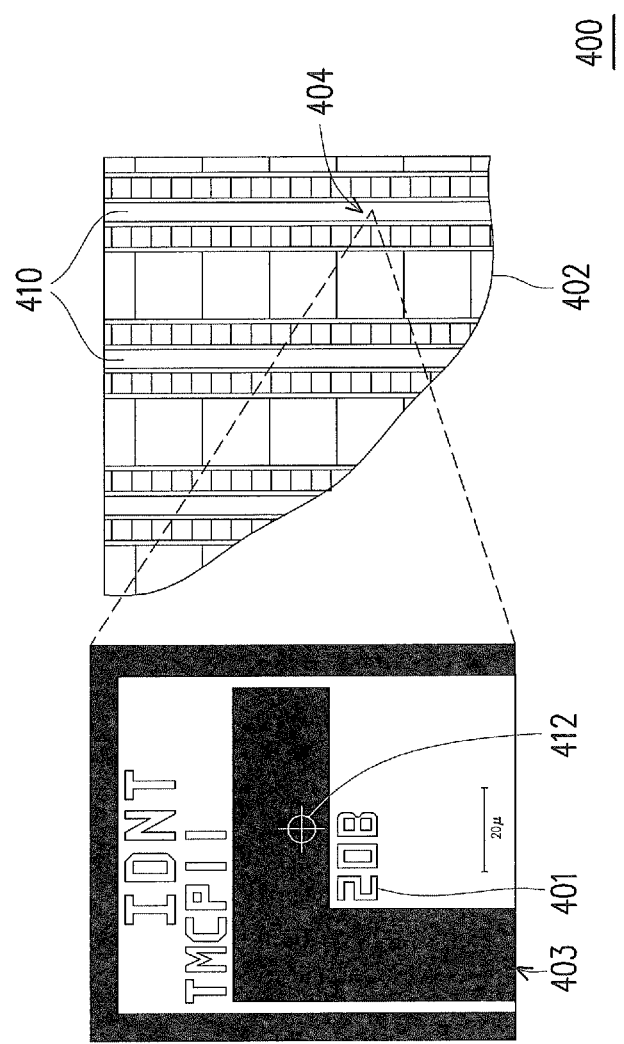
FIG. 4A is an illustration of a semiconductor workpiece where fiducials may be embedded, in accordance with some embodiments.

FIG. 4A is an illustration 400 of where fiducials 401 may be embedded in a semiconductor workpiece 402, in accordance with some embodiments. The illustration includes a magnification 403 of a part 404 of the semiconductor workpiece 402 (e.g., a wafer). The magnification 403 includes the fiducial 401 as an alphanumeric symbol "20B." In various embodiments, fiducials may be an alphabetic, numeric, and/or alphanumeric symbol.

Advantageously, an alphanumeric symbol may be easier for a human to recognize for quality control and may be easily modifiable by existing computing systems that utilize an alphanumeric symbol system so that various combinations of unique fiducials may be created as new alphanumeric symbol combinations. The fiducial 401 may be within a scribe lines 410. Furthermore, the illustration 400 includes a reference fiducial location 412 at the center of the magnification of the image data (e.g., an image) characterizing the semiconductor workpiece (e.g., wafer).

Figure 4B:
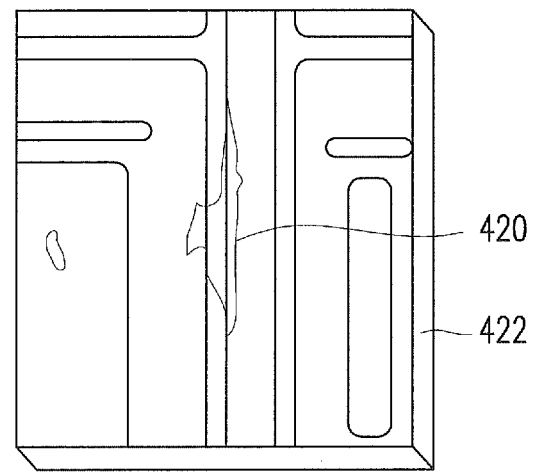
FIG. 4B is an illustration of an exemplary defect, in accordance with some embodiments.

FIG. 4B is an illustration of an exemplary defect 420, in accordance with some embodiments. The defect 420 may be an imperfection observable on a semiconductor workpiece 422. Defects 420 may be deleterious as they may decrease yield during semiconductor processing.

Figure 4C:
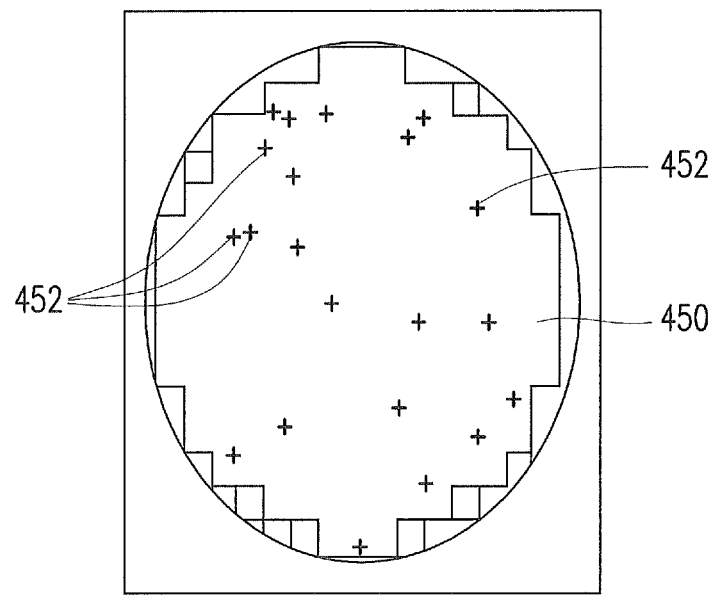
FIG. 4C is an illustration of multiple defect locations across a wafer, in accordance with some embodiments.

FIG. 4C is an illustration of a semiconductor workpiece 450 (e.g., a wafer) with various defect locations 452 noted across the semiconductor workpiece, in accordance with some embodiments. The defect locations 452 may be produced (e.g., noted) by a defect scanner, as discussed above in connection with FIG. 1, and will not be discussed again here for brevity.

Figure 5A:
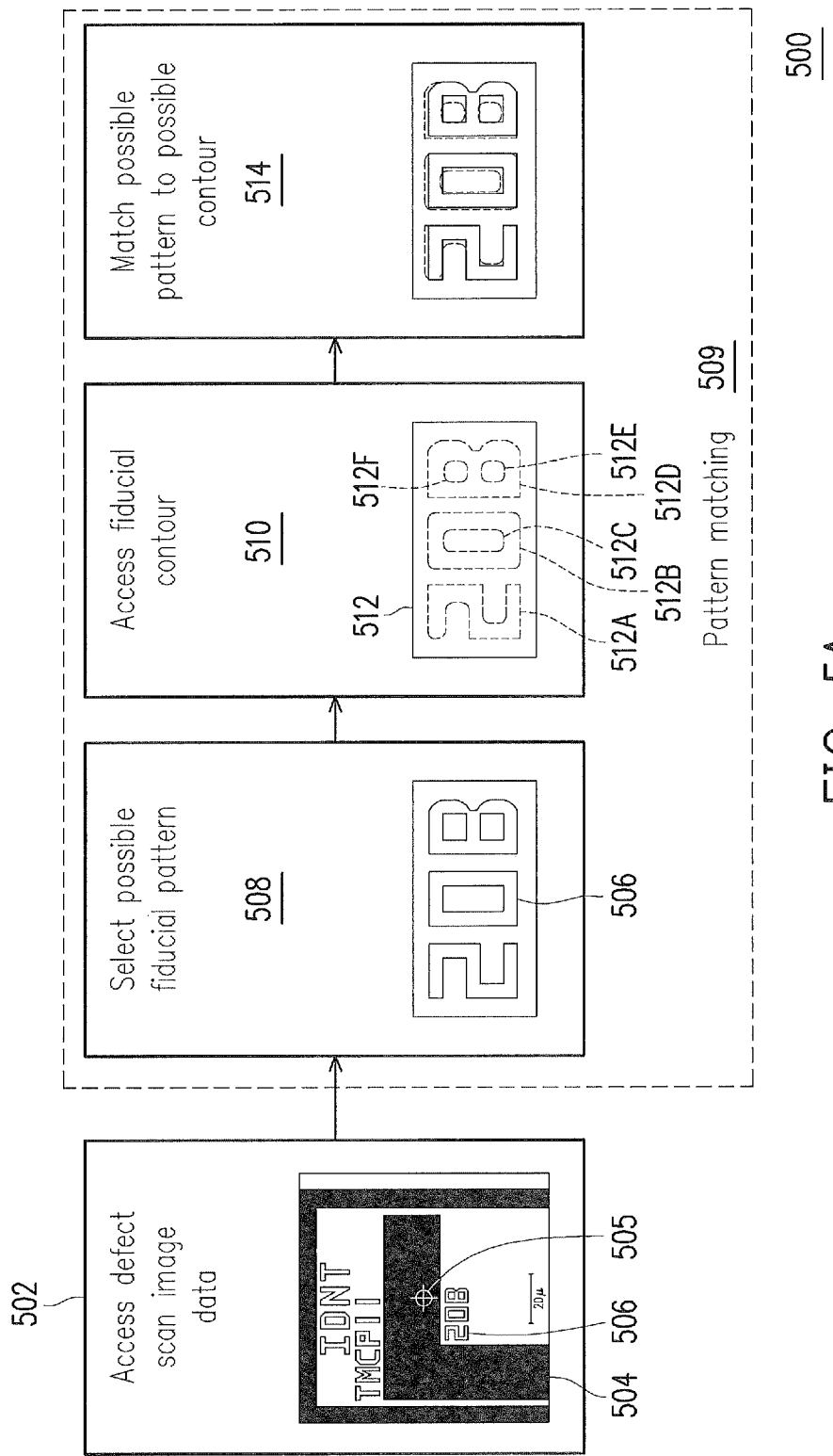
FIG. 5A is a block diagram of a process for detecting fiducials, in accordance with some embodiments.

FIG. 5A is a block diagram of a process 500 for detecting fiducials, in accordance with some embodiments. The process 500 may be performed by a defect offset correction module. It is noted that the process 500 is merely an example, and is not intended to limit the present disclosure. Accordingly, it is understood that additional operations may be provided before, during, and after the process 500, certain operations may be omitted, certain operations may be performed concurrently with other operations, and that some other operations may only be briefly described herein.

At block 502, a defect offset correction module may access image data 504. This image data 504 may be centered at a reference fiducial location 505 (illustrated with a crosshair). As discussed above, the image data 504 may characterize a semiconductor workpiece. The image data 504 may also characterize fiducials (as fiducial patterns 506) embedded in the semiconductor workpiece. By being accessed, the image data 504 may be retrieved from a computer readable storage or captured by an image sensor, as discussed above.

At block 508 the defect offset correction module may select a possible fiducial pattern 506 in the image data 504. This discussion of a possible fiducial pattern 506 is provided for ease of explanation as a selection, or determination, of a part of the image data in which a fiducial pattern 506 may be detected. The selection may be based upon any criteria and may be performed in any manner that may evaluate image data 504. For example, in certain embodiments, the selection may be part of an incremental scan through image data 504 that partitions the image data into parts and sequentially evaluates each of the parts as a possible fiducial pattern 506. The possible fiducial pattern 506 may be part of the image data 504 that includes features that may be indicative of a fiducial embedded in a semiconductor workpiece (e.g., a wafer). The possible fiducial pattern 506 may be utilized for pattern matching 509, as discussed further below.

At block 510, the defect offset correction module may retrieve a fiducial contour 512 to perform pattern matching 509. By being accessed, the fiducial contour 512 may be retrieved from a computer readable storage, as discussed above in connection with FIG. 2. Returning to FIG. 5A, the fiducial contour 512 may be a reference for image data that characterizes a fiducial pattern and may be utilized to evaluate a possible fiducial pattern 506 in image data, as will be discussed below. The fiducial contour may include multiple contour features that characterizes a fiducial pattern. For example, there may be six contour features 512A-512F that are part of the fiducial contour 512. Each of these contour features may be a unique part of the fiducial contour 512 and may be a point of reference in determining whether the possible fiducial pattern 506 matches the fiducial contour 512. Although the six contour features 512A-512F are illustrated as edges, contour features may be any aspect of a fiducial pattern that may be detected to evaluate whether a potential fiducial pattern is a fiducial pattern, such as textures, saturation, gradients, and the like.

At block 514, the defect offset correction module may evaluate whether the possible fiducial pattern 506 in the image data 504 matches the fiducial contour 512. In certain embodiments, the defect offset correction module may determine an amount of similarity, or overlap, between the possible fiducial pattern 506 and the fiducial contour 512 (e.g., by comparing the possible fiducial pattern 506 and the fiducial contour 512). Specifically, if the amount of overlap exceeds an edge threshold, then the possible fiducial pattern 506 may be determined to have sufficient overlap with the fiducial contour 512 and be noted as a detected fiducial pattern. For example, the edge threshold may be from about 50% to about 99% overlap or similarity. Stated another way, a fiducial pattern may be determined based on whether a portion of the image data includes contour features (e.g., edges, saturation, gradients, etc.) that are sufficiently similar to, or that are the same as, the contour features of the fiducial contour. In certain embodiments, the matching may be implemented with any of a variety of conventional object recognition techniques, such as edge matching, greyscale matching, and gradient matching. As noted above, these detected fiducial patterns may be ascribed with a detected fiducial location and used to determine an offset, which may be a difference in location between a detected fiducial location and reference fiducial location.

Figure 5B:
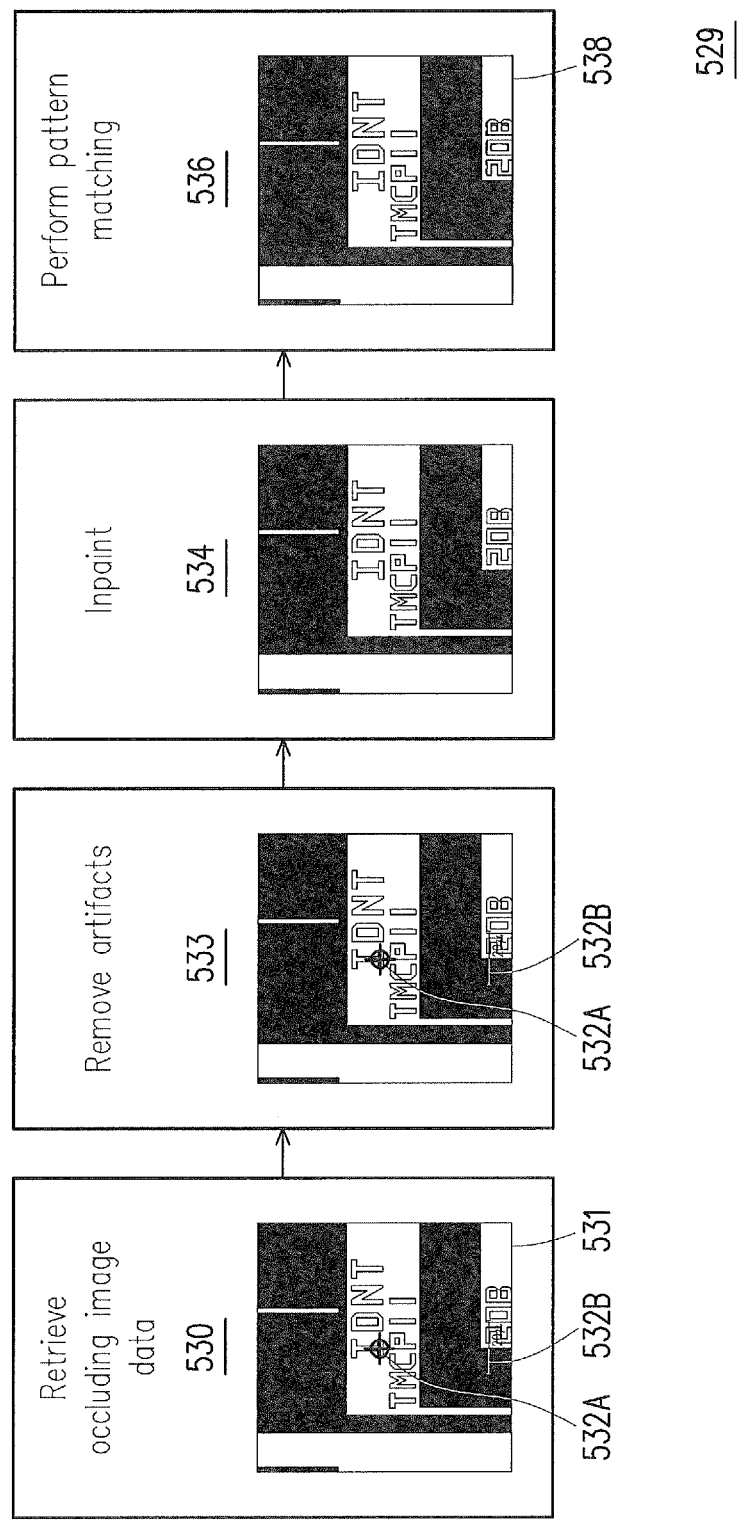
FIG. 5B is a block diagram of a process for detecting occluded fiducials, in accordance with some embodiments.

FIG. 5B is a block diagram of a process 529 for detecting occluded fiducials, in accordance with some embodiments. An occluded fiducial may be a possible fiducial pattern with an overlaying artifact that occludes, or obfuscates, the possible fiducial pattern such that it may be more difficult to detect a fiducial pattern from the possible fiducial pattern due to the occluding artifact. The process 529 may be performed by a defect offset correction module. It is noted that the process 529 is merely an example, and is not intended to limit the present disclosure. Accordingly, it is understood that additional operations may be provided before, during, and after the process 529, certain operations may be omitted, certain operations may be performed concurrently with other operations, and that some other operations may only be briefly described herein.

At block 530, a defect offset correction module may access the occluded image data 531 and detect an occluded fiducial. The occluded image data may be image data with an occluded fiducial. This may be similar to block 502 in FIG. 5A, but with occluded image data that includes various artifacts 532A, 532B. These artifacts may be annotations in the image data, such as scales, cursors, and reticles.

In certain embodiments, the artifacts 532A and 532B may be detected as part of a particular layer of the occluded image data 531 (e.g., a set of related artifacts with metadata that indicates that the set may be selectable from the occluded image data 531). In other embodiments, the artifacts to be detected may be predetermined (e.g., the artifacts may be associated with a known artifact contour that may be referenced to detect the artifact in the occluded image data 531). Such predetermined artifacts may be detected with any of a variety of standard object recognition techniques, such as edge matching, greyscale matching, and gradient matching.

At block 533, the defect offset correction module may remove the artifacts 532A and 532B in the occluded image data 531. At block 534, the defect offset correction module may remove the detected artifacts 532A and 532B in the occluded image data 531. The detected artifacts 532A and 532B may be removed by being deleted or otherwise separated from the occluded image data 531.

At block 534, the defect offset correction module may inpaint the image data so that the parts of the image data with the removed artifacts may be inpainted and restored to a form without the artifacts. Inpainting may be performed in accordance with conventional inpainting processes, such as via interpolation techniques, and will not be discussed further herein for brevity.

At block 536, the defect offset correction module may use the inpainted image data 538 to perform pattern matching. In reference to FIG. 5A, the inpainted image data 538 may be utilized as the image data 504 in block 502. Pattern matching is discussed above in connection with FIG. 5A and will not be repeated here for brevity.

Figure 5C:
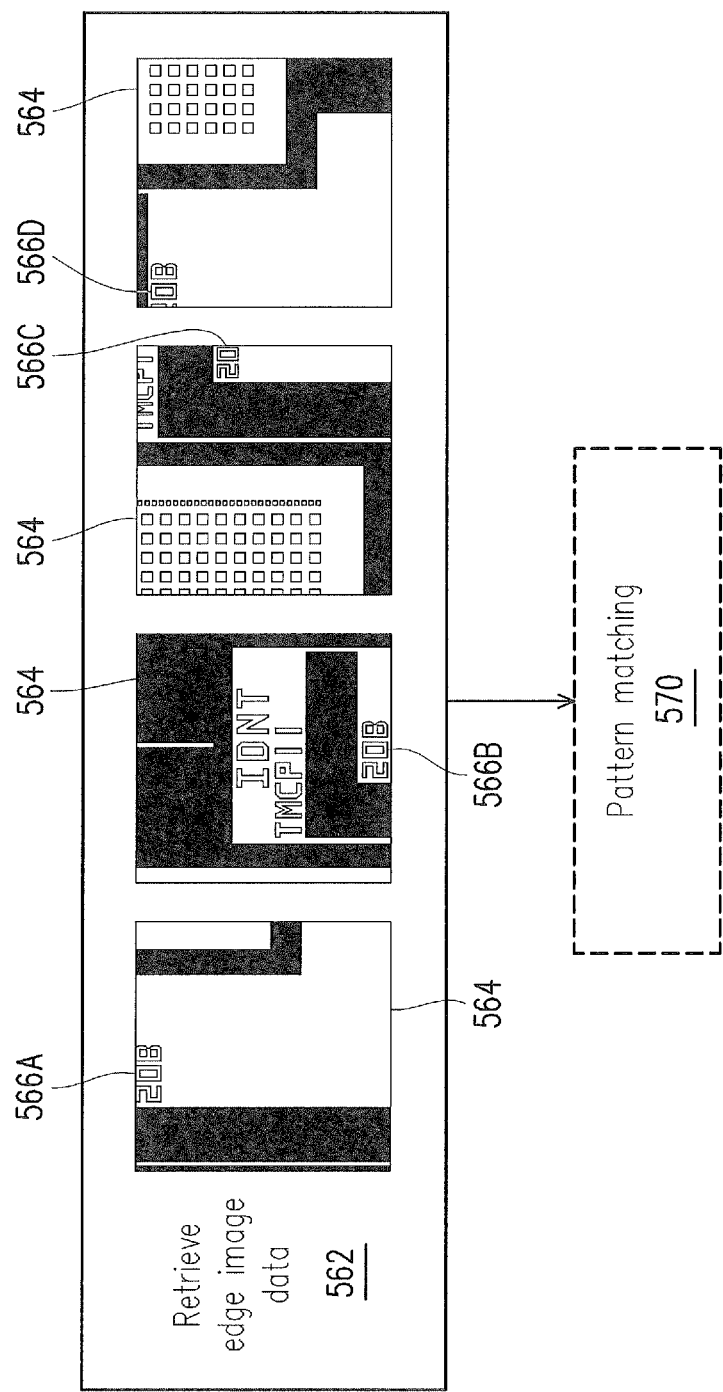
FIG. 5C is a block diagram of a process for detecting fiducials with incomplete image data, in accordance with some embodiments.

FIG. 5C is a block diagram of a process for detecting fiducials from an edge fiducial pattern, in accordance with some embodiments. An edge fiducial pattern (also termed as an incomplete fiducial pattern) may be a possible fiducial pattern that is partially represented in image data. Accordingly, a fiducial pattern may be more difficult to recognize when presented as an edge fiducial pattern. In certain embodiments, edge fiducial patterns may be illustrated as a partially presented fiducial pattern due to image data that is cut off. This type of image data may also termed as edge image data, (e.g., where image data is only available for part of a fiducial pattern). In further embodiments, edge fiducial patterns may also be reflective of a fiducial pattern that is occluded by an artifact such that only part of the possible fiducial pattern is accessible (e.g., available for analysis) by a defect offset correction module. At block 562, a defect offset correction module may access edge image data 564 that includes edge fiducial patterns 566A, 566B, 566C and 566D. The edge fiducial patterns 566A, 566B, 566C and 566D may be partially presented possible fiducial patterns due to a limitation in the image data (e.g., due to the image data being cut off). Also, the edge fiducial patterns 566A, 566B, 566C, and 566D may be part of the same image data but are presented, for ease of illustration, as separate images.

At block 570, the defect offset correction module may use the edge image data 564 to perform pattern matching. In reference to FIG. 5A, the edge image data 564 may be utilized as the image data 504 in block 502. As noted above in connection with FIG. 5A, if an amount of overlap between a possible fiducial pattern (e.g., an edge fiducial pattern) and a fiducial contour exceeds an edge threshold, then the edge fiducial pattern may be determined to have sufficient overlap with the fiducial contour and be noted as a detected fiducial pattern. Pattern matching is discussed above in connection with FIG. 5A and will not be repeated here for brevity.

In some embodiments, a method includes: receiving a defect map from a defect scanner, wherein the defect map comprises at least one defect location of a semiconductor workpiece; annotating the defect map with a reference fiducial location of the semiconductor workpiece; determining a detected fiducial location within image data of the semiconductor workpiece; determining an offset correction based on comparing the detected fiducial location with the reference fiducial location; producing a corrected defect map by applying the offset correction to the defect map, wherein the applying the offset correction translocates the at least one defect location; and transferring the corrected defect map to a defect reviewer configured to perform root cause analysis based on the corrected defect map.

In further embodiments, a method includes: receiving a defect map from a defect scanner, wherein the defect map comprises a plurality of defect locations; annotating the defect map with a plurality of reference fiducial locations; determining multiple detected fiducial locations within image data of a semiconductor workpiece; determining a plurality of offset corrections based on comparing each of the multiple detected fiducial locations with respective reference fiducial locations; and producing a corrected defect map by applying the plurality of offset corrections to the defect map, wherein the applying the plurality of offset corrections translocates each of the plurality of defect locations.

In other embodiments, a defect offset module includes: a network connection module configured to: access a defect map, wherein the defect map comprises at least one defect location; at least one processor configured to: annotate the defect map with a reference fiducial location; determine a detected fiducial location within image data of a semiconductor workpiece; determine an offset correction based on comparing the detected fiducial location with an associated reference fiducial location; and produce a corrected defect map by applying the offset correction to the defect map, wherein the applying the offset correction translocates the at least one defect location, wherein the network connection module is further configured to provide the corrected defect map to a defect reviewer configured to perform root cause analysis based on the corrected defect map.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements, blocks and/or steps. Thus, such conditional language is not generally intended to imply that features, elements, blocks and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method of defect review, comprising:
  receiving a defect map, wherein the defect map comprises at least one defect location of a semiconductor workpiece;
  determining a detected fiducial location within image data of the semiconductor workpiece, wherein the detected fiducial location is based on a predetermined pattern provided in a scribe line of the semiconductor workpiece;
  determining an offset correction based on comparing the detected fiducial location with a reference fiducial location provided on the defect map; and
  producing a corrected defect map by applying the offset correction to the defect map.

2. The method of claim 1, further comprising:
  transferring the corrected defect map to a defect reviewer to perform a root cause analysis is based on the corrected defect map.

3. The method of claim 1, wherein the predetermined pattern is overlaid with a scale or a cursor.

4. The method of claim 1, further comprising determining the detected fiducial location within image data of the semiconductor workpiece centered at the reference fiducial location.

5. The method of claim 1, wherein the determining the detected fiducial location comprises determining whether a possible fiducial pattern found in the image data overlaps with a fiducial contour.

6. The method of claim 1, wherein the determining the detected fiducial location comprises determining whether a percentage of overlap between a possible fiducial pattern and a fiducial contour exceeds an edge threshold.

7. The method of claim 1, wherein the predetermined pattern is an alphanumeric pattern.

8. The method of claim 1, further comprising determining multiple detected fiducial locations within the image data, wherein the offset correction is based on comparing each of the multiple detected fiducial locations with respective reference fiducial locations.

9. A method for defect map correction, comprising:
receiving a defect map of a semiconductor workpiece;
determining multiple detected fiducial locations within image data of the semiconductor workpiece, wherein each of the multiple detected fiducial locations is based on respective multiple predetermined patterns provided in a scribe line of the semiconductor workpiece;
determining a plurality of offset corrections based on comparing each of the multiple detected fiducial locations with at least one reference fiducial location provided on the defect map; and
producing a corrected defect map by applying the plurality of offset corrections to the defect map.

10. The method of claim 9, wherein the defect map comprises a plurality of reference fiducial locations.

11. The method of claim 9, wherein the applying the plurality of offset corrections to the defect map is performed for each of the plurality of offset corrections serially.

12. The method of claim 9, wherein each of the multiple detected fiducial locations are determined based on detection of a fiducial pattern within the image data.

13. The method of claim 9, further comprising:
transferring the corrected defect map to a defect reviewer configured to perform root cause analysis based on the corrected defect map, wherein the root cause analysis analyzes at least one defect at each of the plurality of defect locations to determine at least one common cause of the at least one defect at each of the plurality of defect locations.

14. A defect offset module, comprising:
at least one processor configured to:
receive a defect map, wherein the defect map comprises at least one defect location;
determine a detected fiducial location within image data of a semiconductor workpiece, wherein the detected fiducial location is based on a predetermined pattern provided in a scribe line of the semiconductor workpiece;
determine an offset correction based on comparing the detected fiducial location with an associated reference fiducial location provided on the defect map; and
applying the offset correction to translocate the at least one defect location to produce a corrected defect map.

15. The defect offset module of claim 14, further comprising:
a network connection module, wherein the network connection module is further configured to provide the corrected defect map to a defect reviewer configured to perform root cause analysis based on the corrected defect map.

16. The defect offset module of claim 15, wherein the network connection module is at least one of: a network bus and network transceiver.

17. The defect offset module of claim 15, wherein the network module is further configured to annotate the defect map with a plurality of reference fiducial locations.

18. The defect offset module of claim 15, wherein the network module is further configured to transfer the corrected defect map to a defect reviewer configured to perform root cause analysis based on the corrected defect map, wherein the root cause analysis analyzes at least one defect at each of the plurality of defect locations to determine at least one common cause of the at least one defect at each of the plurality of defect locations.

19. The defect offset module of claim 14, wherein the predetermined pattern is provided in a scribe line of the semiconductor workpiece.

20. The defect offset module of claim 14, wherein the at least one processor is further configured to compare a possible fiducial pattern, found in the image data, with a fiducial contour.

* * * * *